United States Patent [19]

Liang

[11] Patent Number: 5,393,687
[45] Date of Patent: Feb. 28, 1995

[54] METHOD OF MAKING BURIED CONTACT MODULE WITH MULTIPLE POLY SI LAYERS

[75] Inventor: Mong-Song Liang, Cupertino, Calif.

[73] Assignee: Taiwan Semiconductor Manufacturing Company, Hsinchu, Taiwan, Prov. of China

[21] Appl. No.: 167,085

[22] Filed: Dec. 16, 1993

[51] Int. Cl.6 .................. H01L 21/265; H01L 21/225
[52] U.S. Cl. ...................................... 437/46; 437/162; 148/DIG. 35
[58] Field of Search ................. 437/46, 109, 162, 233, 437/967, 191; 148/DIG. 35, DIG.122

[56] References Cited

U.S. PATENT DOCUMENTS

| | | | |
|---|---|---|---|
| 4,407,060 | 10/1983 | Sakurai | 29/576 E |
| 4,945,070 | 7/1990 | Hsu | 437/160 |
| 4,950,617 | 8/1990 | Kumagai et al. | 437/41 |
| 4,978,629 | 12/1990 | Komori et al. | 437/162 |
| 5,030,584 | 7/1991 | Nakata | 437/44 |
| 5,049,514 | 9/1991 | Mori | 437/41 |
| 5,323,022 | 6/1994 | Glass et al. | 257/77 |

FOREIGN PATENT DOCUMENTS

| | | | |
|---|---|---|---|
| 61-208829A | 9/1986 | Japan | 437/162 |
| 4349617A | 12/1992 | Japan | 437/967 |
| 547703A | 2/1993 | Japan | 437/162 |
| 5129215A | 5/1993 | Japan | 437/162 |

*Primary Examiner*—George Fourson
*Assistant Examiner*—Richard A. Booth
*Attorney, Agent, or Firm*—George O. Saile

[57] ABSTRACT

A new method of forming source/drain buried contact junctions is described. The method of forming a buried contact to a source/drain junction or other active device region in a silicon substrate is described. A first polysilicon layer is deposited over the surface of a silicon substrate. A second layer of polysilicon is deposited over the first layer of polysilicon wherein the polysilicon grain boundaries of the first and second polysilicon layers will be mismatched. The second polysilicon layer is doped. The grain boundary mismatch will slow the diffusion of the dopant into the silicon substrate. The dopant is driven in to form the buried contact with a shallow junction.

31 Claims, 7 Drawing Sheets

METHOD OF MAKING BURIED CONTACT MODULE WITH MULTIPLE POLY SI LAYERS

BACKGROUND OF THE INVENTION

1. Field of the Invention

The invention relates to the fabrication of integrated circuit devices, and more particularly, to a method of forming shallow buried contact junctions in the fabrication of integrated circuits.

2. Description of the Prior Art

A typical buried contact process flow is to deposit a doped layer of polysilicon over and on the planned buried contact regions, which may be source/drain regions. The structure is heated and the source/drain regions are doped by outdiffusion of dopants from the doped polysilicon layer into the silicon substrate. The doped polysilicon layer is allowed to remain on the source/drain regions as their contacts. This is called the buried contact process.

Because of the high diffusivity of the polysilicon dopant, it is difficult to control junction depth. A number of patents have addressed this and other problems involving forming source/drain regions. U.S. Pat. No. 5,049,514 to Mori shows a process of doping polysilicon, forming an opening to the substrate, forming a metal silicide layer within the opening, ion implanting, and annealing to form the source/drain region. U.S. Pat. No. 5,030,584 to H. Nakata describes a process involving outdiffusion to form source/drain regions and to leave the contact and source of dopants for the source/drain regions in place. While this patent's invention has the advantage of self alignment of the contact to the source/drain, it does not have the desired tailoring of the source/drain regions to the optimum conditions for the under one micron era. Patent disclosure Ser. No. 07/941229 to J. Y. Lee filed on Sept. 9, 1992 uses two layers of polysilicon to form a buried contact region in the substrate, However, only poly 2 actually touches the substrate.

SUMMARY OF THE INVENTION

A principal object of the present invention is to provide an effective and very manufacturable method of forming buried contact junctions.

Another object of the present invention is to provide a method of forming shallow buried contact junctions with a junction depth that is $\frac{1}{3}$ to $\frac{1}{2}$ that of the prior art.

In accordance with the objects of this invention a new method of forming source/drain buried contact junctions is achieved. The method of forming a buried contact to a source/drain junction or other active device region in a silicon substrate is described. A first polysilicon layer is deposited over the surface of a silicon substrate. A second layer of polysilicon is deposited over the first layer of polysilicon wherein the polysilicon grain boundaries of the first and second polysilicon layers will be mismatched. The second polysilicon layer is doped. The grain boundary mismatch will slow the diffusion of the dopant into the silicon substrate. The dopant is driven in to form the buried contact with a shallow junction.

BRIEF DESCRIPTION OF THE DRAWINGS

In the accompanying drawings forming a material part of this description, there is shown.

DESCRIPTION OF THE PREFERRED EMBODIMENTS

Figure 1:
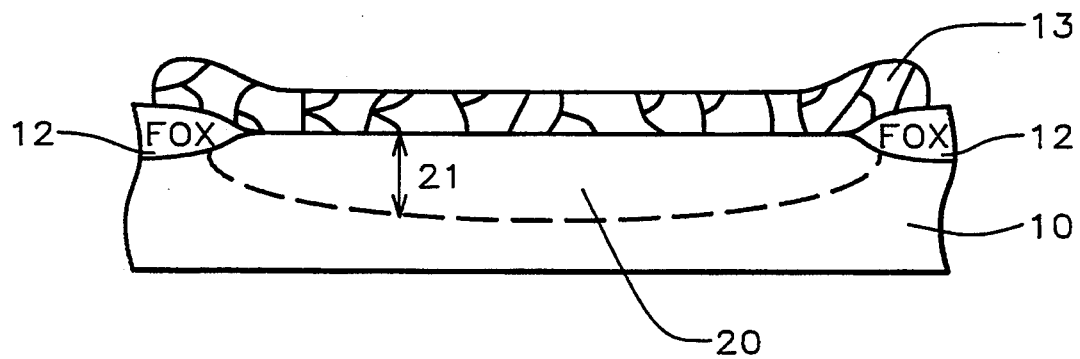
FIG. 1 schematically illustrates in cross-sectional representation the polysilicon grain boundaries of the process of the prior art.

Referring now more particularly to FIG. 1, there is shown a portion of a partially completed integrated circuit of the prior art. There is shown a monocrystalline semiconductor substrate 10 in which there are formed field oxide regions 12. A polysilicon layer 13 has been deposited over the surface of the substrate. The polysilicon layer is doped. The dopant diffuses into the silicon substrate to form the buried junction region 20 with a junction depth of 21.

Figure 2:
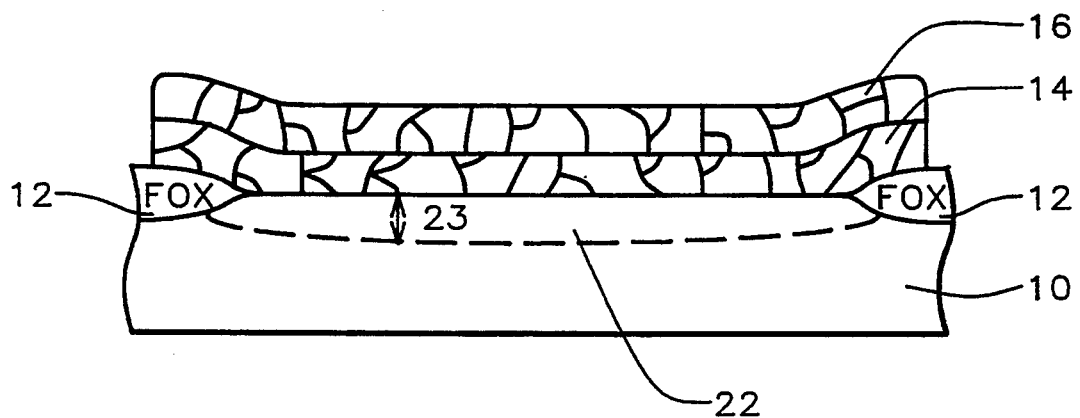
FIG. 2 schematically illustrates in cross-sectional representation the polysilicon grain boundaries of the process of the present invention.

The process of the invention now will be described. Referring to FIG. 2, there is shown a portion of a partially completed integrated circuit. There is shown a monocrystalline semiconductor substrate 10 in which there are formed field oxide regions 12.

The polysilicon layer 14 is blanket deposited by low pressure chemical vapor deposition (LPCVD) at a temperature of between about 450° to 625° C. to a thickness of between about 50 to 2500 Angstroms. The wafer is removed from the furnace and allowed to cool to between about 25° to 380° C. The wafer is returned to the furnace and a second layer 16 of polysilicon is deposited at the same temperature of between about 450° to 625° C. to a thickness of between about 100 to 2500 Angstroms. The wafer is again cooled, and a third layer of polysilicon (not shown) may be deposited, as described above.

Cooling the wafer to less than about 300° C. between polysilicon layer depositions prevents the growth of native oxide between the layers. Alternatively, a dilute hydrofluoric acid dip before subsequent layer deposition will prevent native oxide formation between layers.

After the polysilicon layers have been formed, the dopant is applied either by diffusion or by ion implanting the top polysilicon layer. For diffusion, a POCl$_3$ process is used at a high temperature of between about 850° to 950° C. For ion implantation, phosphorus or arsenic ions are implanted to produce N+ regions or boron or $BF_2$ ions are implanted to produce P+ regions. Preferred dosages are in the range of about 5 E 14 to 5 E 16 atoms/cm². Alternately, the top polysilicon layer could be in-situ doped with phosphine.

Polysilicon grain growth is affected by deposited surface condition. Therefore, the grain orientation is different for deposition on single crystal silicon, silicon dioxide, or polysilicon layers. This causes the mismatch in grain boundaries seen in FIG. 2. The mismatched polysilicon grain boundaries prevent the channeling of the dopants so that the diffusivity of the dopants into the silicon substrate is reduced.

The dopants are driven into the silicon substrate at a temperature of between about 800° to 1000° C. This is done typically in subsequent back-end thermal cycles such as source/drain oxidation, interlevel dielectrics densification, and borophosphosilicate glass (BPSG) flow. The completed buried junction 22 has a junction depth 23 which is $\frac{1}{3}$ to $\frac{1}{2}$ the junction depth 21 of the prior art, shown in FIG. 1.

This approach can be directly applied on static random access memory (SRAM) buried contacts and dynamic random access memory (DRAM) cell contacts for the next generation technology development.

Figure 3:
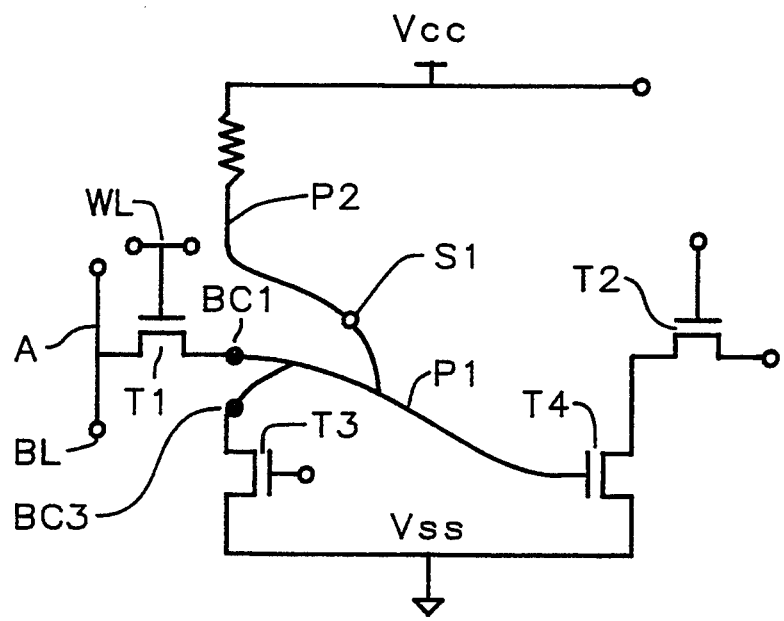
FIG. 3 schematically illustrates a circuit diagram of one preferred embodiment of this invention for a static random access memory (SRAM).
Figure 4:
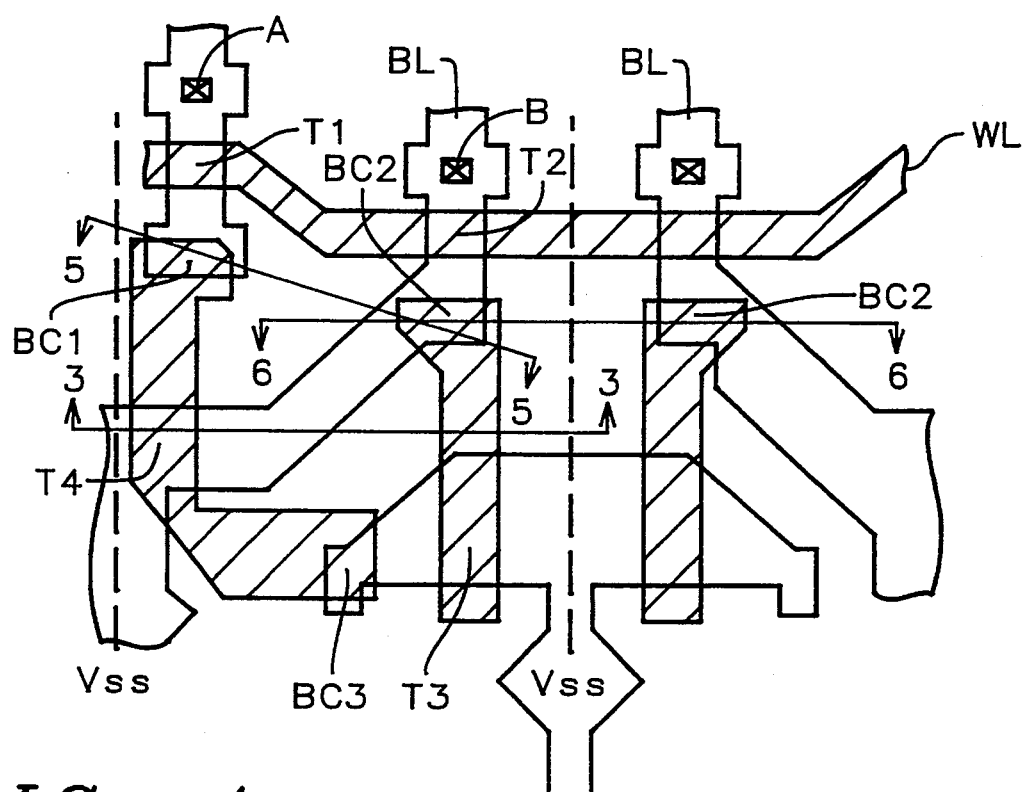
FIG. 4 schematically illustrates a top view of one preferred embodiment of this invention for a SRAM.

Referring now to FIG. 3, there is shown a circuit diagram of a SRAM cell. This SRAM cell is a 4-transistor polysilicon-load flip-flop inverter connection. It includes 2 access transistors T1 and T2, 2 pull-down transistors T3 and T4, and 2 high-resistivity polysilicon regions P1 and P2 as load elements. Bit line (BL) and word line (WL) are also shown. Buried contacts BC1 and BC3 are shown. S1 is a stacked contact. FIG. 4 is a top view of the SRAM circuit in FIG. 3. (View 3—3 is indicated on FIG. 4) The stacked contact S1 is not illustrated in FIG. 4.

Figure 5:
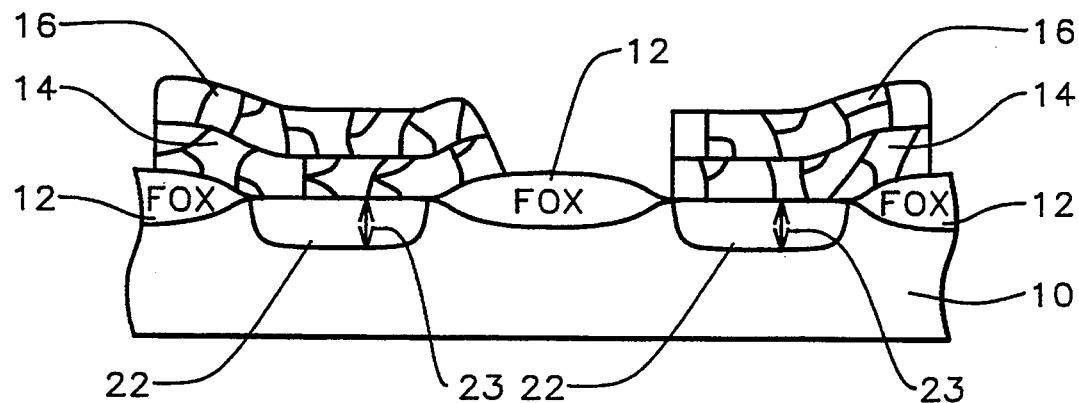
FIG. 5 schematically illustrates in cross-sectional representation the view 5—5 of FIG. 4.

FIG. 5 illustrates view 5—5 of FIG. 4. Polysilicon layers 14 and 16 form the gates of the pull-down transistors T3 and T4. Junction depth 23 is between about 0.5 to 0.8 microns. For 0.8 micron technology, the junction depth 23 will be approximately 0.7 microns. For 0.65 micron technology, the junction depth 23 will be approximately 0.5 microns.

Figure 6A:
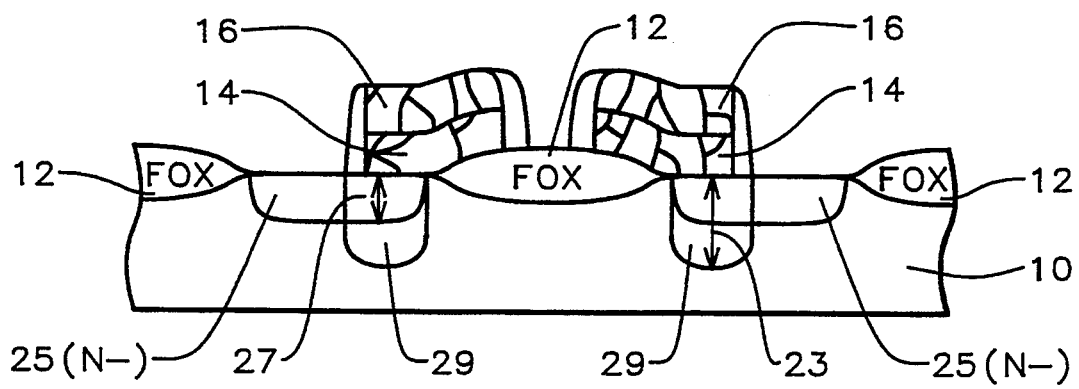
FIG. 6A schematically illustrates in cross-sectional representation one alternative of the view 6—6 of FIG. 4.
Figure 6B:
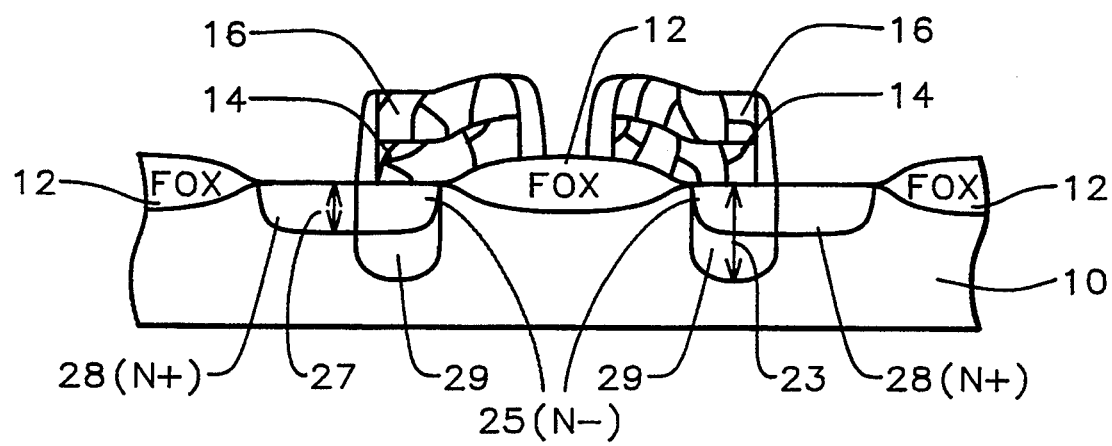
FIG. 6B schematically illustrates in cross-sectional representation a second alternative of the view 6—6 of FIG. 4.

FIGS. 6A and 6B illustrate view 6—6 of FIG. 4. Polysilicon layers 14 and 16 form the capacitor bottom plate of the SRAM. Regions 29 are formed by dopant diffusion from layer 16, which is doped by diffusion or ion implantation. Lightly doped N− regions 25 are formed using arsenic or phosphorus implantation at a dosage of between about 5 E 12 to 5 E 14 atoms/cm² and energy of between about 50 to 100 KeV. In the approach illustrated in FIG. 6A, there is no N+ implantation into the DRAM cell. This is so to reduce any junction leakage caused by the N+ implantation. As described above, junction depth 23 is between about 0.5 to 0.8 microns. The depth 27 of the lightly doped source/drain region 25 is between about 0.15 to 0.20 microns.

In a second approach, illustrated in FIG. 6B, heavily doped N+ regions 28 are formed within the silicon substrate by using arsenic implantation at a dosage of between about 1 E 15 to 6 E 15 atoms/cm². The junction depth 27 will be between about 0.20 to 0.25 microns. As above, the junction depth 23 is between about 0.5 to 0.8 microns.

Figure 7:
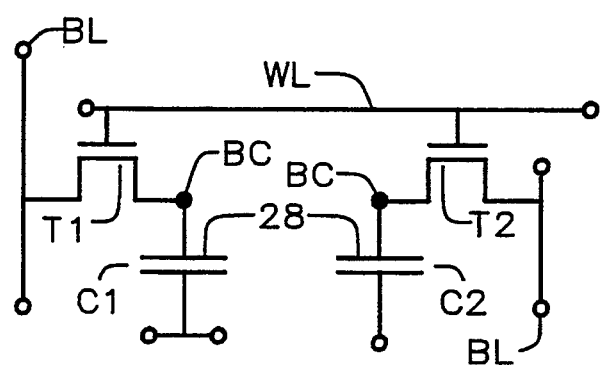
FIG. 7 schematically illustrates a circuit diagram of a second preferred embodiment of this invention for a dynamic random access memory (DRAM).
Figure 8:
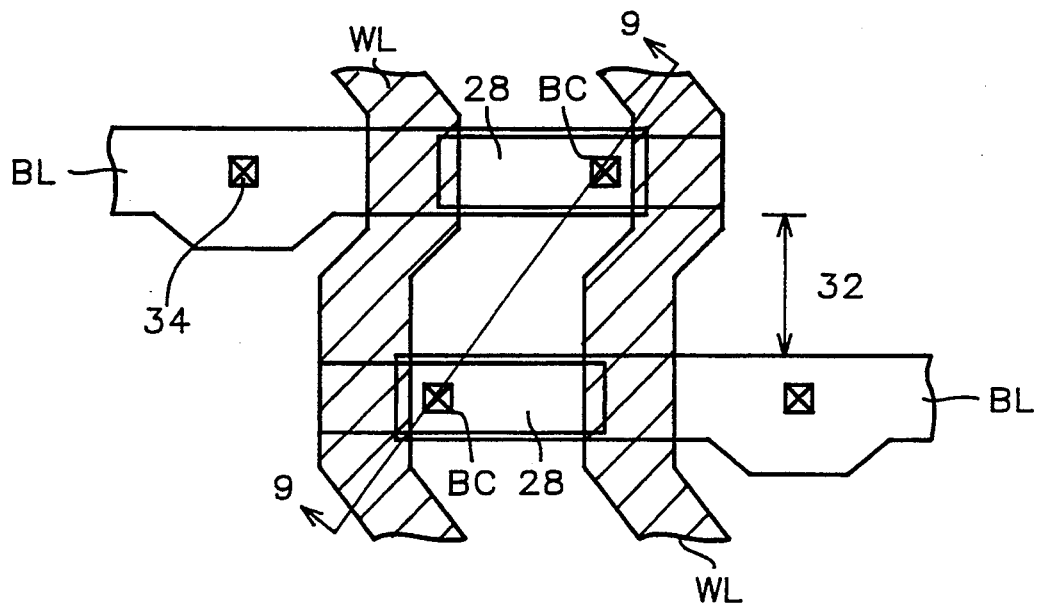
FIG. 8 schematically illustrates a top view of one preferred embodiment of this invention for a DRAM.
Figure 9:
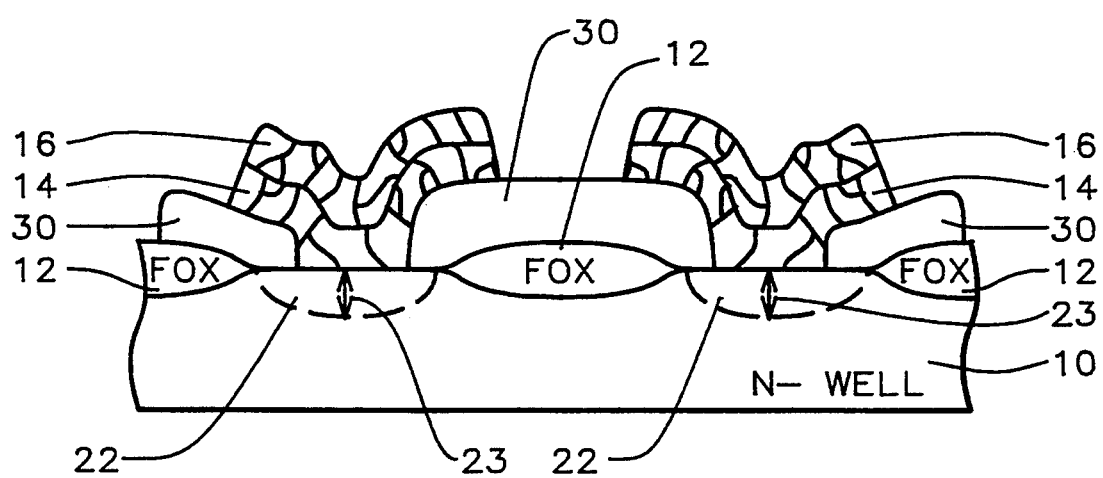
FIG. 9 schematically illustrates in cross-sectional representation the view 9—9 of FIG. 8.

Referring now to FIG. 7, there is shown a circuit diagram of a DRAM cell consisting of an access transistor T1 and a capacitor C1 for charge storage. FIG. 8 is a top view of the DRAM circuit in FIG. 7. Capacitor bottom plates 28 are illustrated here, in FIG. 7, and in FIG. 9, which illustrates view 9—9 of FIG. 8. Also shown in FIG. 8 are word lines (WL) and bit lines (BL). Bit line contact 34 is shown to the left of FIG. 8. Referring to FIG. 9, the capacitor bottom plates 28 are shown. 30 is the interlevel oxide layer. The capacitor dielectric and top capacitor plate are not shown in FIG. 9.

For a 4 Megabit DRAM, the feature size 32 (in FIG. 8) is about 0.7 microns. Junction depth 23 of buried contact region 22 in FIG. 9 will be approximately 0.6 microns for a conventional buried contact. For a 16 Megabit DRAM, the feature size 32 is about 0.5 microns. Junction depth 23 will be approximately 0.3 microns.

EXAMPLES

The following Examples are given to show the important features of the invention and to aid in the understanding thereof and variations may be made by one skilled in the art without departing from the spirit and scope of the invention.

Two or three layers of polysilicon with varying thicknesses were consecutively deposited on bare silicon. The control group had a single deposited polysilicon layer with the same thickness as the total thickness of the experimental samples. All samples were under identical thermal treatment of 30 minutes at 850° C. SIMS analyses were performed to determine junction depth.

EXAMPLE 1

The first Example compared junction depths of buried contacts formed using a two-layer polysilicon sample to the control sample having a total polysilicon thickness of 3500 Angstroms. Dopant sources were ion implant of phosphorus at an energy of 50 KeV and dosage of 6 E 15 atoms/cm² or diffusion of $POCl_3$ at 850° C. The results are shown in Table 1.

TABLE 1

| # | Poly-Si Layer | Dopant | Junction Depth |
|---|---|---|---|
| 1 | 3500 A | P/50/6E15 | 0.12 um |
| 2 | 2000 A/1500 A | P/50/6E15 | 0.04 um |
| 3 | 3500 A | 850° C. $POCl_3$ | 0.13 um |
| 4 | 2000 A/1500 A | 850° C. $POCl_3$ | 0.07 um |

EXAMPLE 2

The second Example compared junction depths of buried contacts formed using a three-layer polysilicon sample to the control sample having a total polysilicon thickness of 5000 Angstroms. Dopant sources were ion implant of phosphorus at an energy of 50 KeV and dosage of 6 E 15 atoms/cm², ion implant of arsenic at an energy of 100 KeV and dosage of 6 E 15 atoms/cm², or diffusion of $POCl_3$ at 850° C. The results are shown in Table 2.

TABLE 2

| # | Poly-Si Layer | Dopant | Junction Depth |
|---|---|---|---|
| 1 | 5000 A | P/50/6E15 | 0.20 um |
| 2 | 2000 A/1500 A/1500 A | P/50/6E15 | 0.07 um |
| 3 | 5000 A | As/100/6E15 | 0.12 um |
| 4 | 2000 A/1500 A/1500 A | As/100/6E15 | 0.08 um |
| 5 | 5000 A | 850° C. $POCl_3$ | 0.20 um |
| 6 | 2000 A/1500 A/1500 A | 850° C. $POCl_3$ | 0.06 um |

Figure 10:
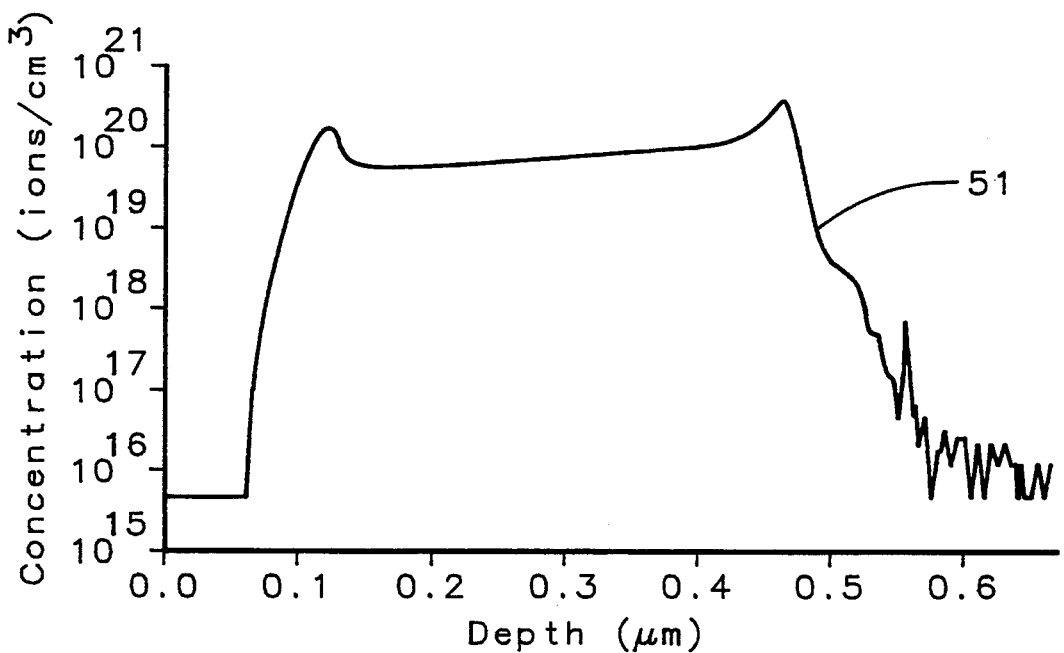
FIGS. 10, 11, and 12 illustrate in graphical representation the sheet resistance of various wafer samples.
Figure 11:
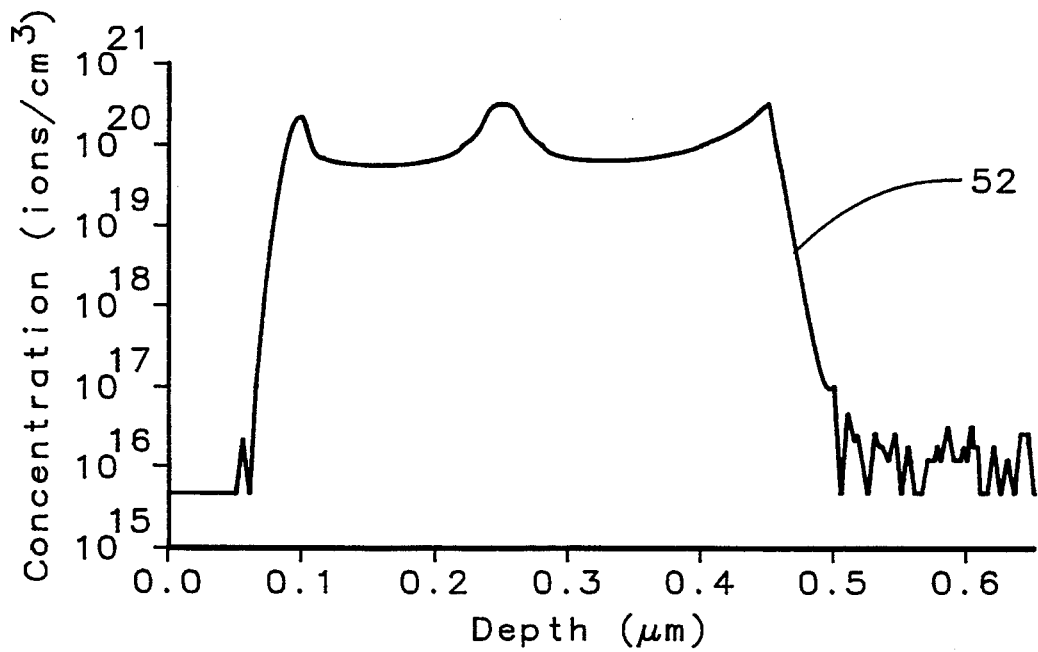
Figure 12:
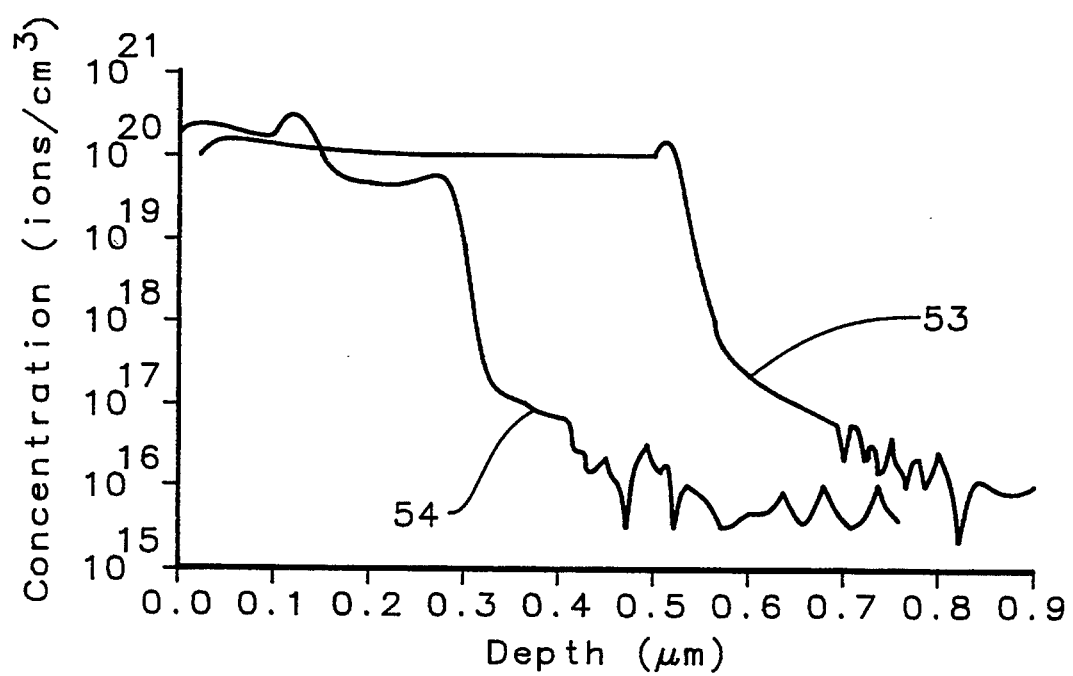

From the two Examples shown above, it can be seen that junction depth is significantly reduced, from ⅓ to ½, for samples with multiple deposits of polysilicon layers. Representative SIMS analysis profiles are shown in FIGS. 10, 11, and 12. FIG. 10 is the SIMS profile 51 for the sample number 1 in Table 1. FIG. 11 is the SIMS profile 52 for the sample number 2 in Table 1. FIG. 12 shows the SIMS profile for samples 3 (line 53) and 4 (line 54) in Table 2. From the surface concentration of SIMS profiles, it can be seen that the sheet resistance of the multiple layer samples is comparable or smaller than the sheet resistance of the control group.

While the invention has been particularly shown and described with reference to the preferred embodiments thereof, it will be understood by those skilled in the art that various changes in form and details may be made without departing from the spirit and scope of the invention.

What is claimed is:

1. The method of forming a buried contact with a shallow junction in a silicon substrate comprising:
    depositing a first polysilicon layer over the surface of said silicon substrate;
    cooling said silicon substrate after said deposition of said first polysilicon layer to a temperature lower than the deposition temperature;
    depositing a second layer of polysilicon on said first layer of polysilicon after said silicon substrate has been cooled wherein the polysilicon grain boundaries of said first and second polysilicon layers will be mismatched;
    doping said second polysilicon layer wherein the said grain boundary mismatch will slow the diffusion of the dopant into said silicon substrate; and
    driving in said dopant to form said buried contact with a shallow junction.

2. The method of claim 1 wherein a third polysilicon layer is deposited overlying said second polysilicon layer wherein said substrate is cooled after the deposition of said second polysilicon layer and before deposition of said third polysilicon layer and wherein said third polysilicon layer is doped to form said buried contact.

3. The method of claim 1 wherein the thickness of said first polysilicon layer is between about 50 to 2500 Angstroms.

4. The method of claim 1 wherein the thickness of said second polysilicon layer is between about 100 to 2500 Angstroms.

5. The method of claim 1 wherein said second polysilicon layer is doped by diffusion of $POCl_3$.

6. The method of claim 1 wherein said second polysilicon layer is doped by ion implant of phosphorus with a dosage of between about 5 E 14 to 5 E 16 atoms/$cm^2$.

7. The method of claim 1 wherein said second polysilicon layer is doped by ion implant of arsenic with a dosage of between about 5 E 14 to 5 E 16 atoms/$cm^2$.

8. The method of claim 1 wherein said drive-in of said buried contact is performed at between about 800° to 1000° C. in a nitrogen or oxygen ambient.

9. The method of forming a buried contact with a shallow junction in the formation of a static random access memory (SRAM) integrated circuit comprising:
    depositing a first polysilicon layer over the surface of a silicon substrate;
    cooling said silicon substrate after said deposition of said first polysilicon layer to a temperature lower than the deposition temperature;
    depositing a second layer of polysilicon on said first layer of polysilicon after said silicon substrate has been cooled wherein the polysilicon grain boundaries of said first and second polysilicon layers will be mismatched;
    doping said second polysilicon layer wherein the said grain boundary mismatch will slow the diffusion of the dopant into said silicon substrate; and
    driving in said dopant to form said buried contact with a shallow junction in the formation of said SRAM integrated circuit.

10. The method of claim 9 wherein a third polysilicon layer is deposited overlying said second polysilicon layer wherein said substrate is cooled after the deposition of said second polysilicon layer and before deposition of said third polysilicon layer and wherein said third polysilicon layer is doped to form said buried contact.

11. The method of claim 9 wherein the thickness of said first polysilicon layer is between about 50 to 2500 Angstroms.

12. The method of claim 9 wherein the thickness of said second polysilicon layer is between about 100 to 2500 Angstroms.

13. The method of claim 9 wherein said second polysilicon layer is doped by diffusion of $POCl_3$.

14. The method of claim 9 wherein said second polysilicon layer is doped by ion implant of phosphorus with a dosage of between about 5 E 14 to 5 E 16 atoms/$cm^2$.

15. The method of claim 9 wherein said second polysilicon layer is doped by ion implant of arsenic with a dosage of between about 5 E 14 to 5 E 16 atoms/$cm^2$.

16. The method of claim 9 wherein said drive-in of said buried contact is performed at between about 800° to 1000° C. in a nitrogen or oxygen ambient.

17. The method of claim 9 wherein the junction depth of said buried contact junction is between about 0.5 to 0.8 microns.

18. The method of forming a buried contact with a shallow junction in the formation of a dynamic random access memory (DRAM) integrated circuit comprising:
    depositing a first polysilicon layer over the surface of a silicon substrate;
    cooling said silicon substrate after said deposition of said first polysilicon layer to a temperature lower than the deposition temperature;
    depositing a second layer of polysilicon on said first layer of polysilicon after said silicon substrate has been cooled wherein the polysilicon grain boundaries of said first and second polysilicon layers will be mismatched;
    doping said second polysilicon layer wherein the said grain boundary mismatch will slow the diffusion of the dopant into said silicon substrate; and
    driving in said dopant to form said buried contact with a shallow junction in the formation of said DRAM integrated circuit.

19. The method of claim 18 wherein a third polysilicon layer is deposited overlying said second polysilicon-layer wherein said substrate is cooled after the deposition of said second polysilicon layer and before deposition of said third polysilicon layer and wherein said third polysilicon layer is doped to form said buried contact.

20. The method of claim 18 wherein the thickness of said first polysilicon layer is between about 50 to 2500 Angstroms.

21. The method of claim 18 wherein the thickness of said second polysilicon layer is between about 100 to 2500 Angstroms.

22. The method of claim 18 wherein said second polysilicon layer is doped by diffusion of POCl$_3$.

23. The method of claim 18 wherein said second polysilicon layer is doped by ion implant of phosphorus with a dosage of between about 5 E 14 to 5 E 16 atoms/cm$^2$.

24. The method of claim 18 wherein said second polysilicon layer is doped by ion implant of arsenic with a dosage of between about 5 E 14 to 5 E 16 atoms/cm$^2$.

25. The method of claim 18 wherein said drive-in of said buried contact is performed at between about 800° to 1000° C. in a nitrogen or oxygen ambient.

26. The method of claim 18 wherein for a 4 Megabit DRAM, the junction depth of said buried contact junction is between about 0.4 to 0.6 microns.

27. The method of claim 18 wherein for a 16 Megabit DRAM, the junction depth of said buried contact junction is between about 0.1 to 0.3 microns.

28. The method of forming a buried contact with a shallow junction in a silicon substrate comprising:

depositing a first polysilicon layer over the surface of said silicon substrate;

dipping said silicon substrate in dilute hydrofluoric acid after said deposition of said first polysilicon layer;

depositing a second layer of polysilicon on said first layer of polysilicon after said silicon substrate has been dipped in said hydrofluoric acid wherein the polysilicon grain boundaries of said first and second polysilicon layers will be mismatched;

doping said second polysilicon layer wherein the said grain boundary mismatch will slow the diffusion of the dopant into said silicon substrate; and driving in said dopant to form said buried contact with a shallow junction.

29. The method of claim 28 wherein a third polysilicon layer is deposited overlying said second polysilicon layer wherein said substrate is dipped in dilute hydrofluoric acid after the deposition of said second polysilicon layer and before deposition of said third polysilicon layer and wherein said third polysilicon layer is doped to form said buried contact.

30. The method of claim 28 wherein said buried contact with a shallow junction is formed in the fabrication of a static random access memory (SRAM) integrated circuit.

31. The method of claim 28 wherein said buried contact with a shallow junction is formed in the fabrication of a dynamic random access memory (DRAM) integrated circuit.

* * * * *